United States Patent [19]
Nishiguchi et al.

[11] Patent Number: 5,752,628
[45] Date of Patent: May 19, 1998

[54] CHIP-TYPE ELECTRONIC PART STORAGE CASING AND SUPPLY CASSETTE USING SAME

[75] Inventors: Takeshi Nishiguchi, Kyoto; Kenji Kato; Takayuki Fujita, both of Hirakata; Shigetoshi Negishi, Suita; Kunio Tanaka, Kadoma; Takashi Nakanishi, Asiya; Takatoshi Mitsushima, Nara; Manabu Morita, Neyagawa, all of Japan

[73] Assignee: Matsushita Electric Industrial Co., Ltd., Kadoma, Japan

[21] Appl. No.: 532,661

[22] PCT Filed: Feb. 14, 1995

[86] PCT No.: PCT/JP95/00201

§ 371 Date: Oct. 13, 1995

§ 102(e) Date: Oct. 13, 1995

[87] PCT Pub. No.: WO95/22242

PCT Pub. Date: Aug. 17, 1995

[30] Foreign Application Priority Data

Feb. 15, 1994 [JP] Japan ................. 6-018270

[51] Int. Cl.⁶ ..................................... B67D 5/06
[52] U.S. Cl. ..................... 222/185.1; 222/325
[58] Field of Search ................. 222/185.1, 547, 222/564, 325

[56] References Cited

U.S. PATENT DOCUMENTS 2,525,225  10/1950  Karlovich ................ 222/564 X
4,548,342  10/1985  Fisher ................... 222/185.1 X

FOREIGN PATENT DOCUMENTS 63-127600  5/1988  Japan .
4-8499     1/1992  Japan .

*Primary Examiner*—Gregory L. Hunson
*Attorney, Agent, or Firm*—Spencer & Frank

[57] ABSTRACT

A chip-type electronic part storage casing includes a storage portion for storing chip-type electronic parts in a loose condition; an opening formed in a lower surface of the storage portion for discharging the electronic parts; a shutter for opening and closing the opening; and a scatter prevention member within the storage portion for preventing the electronic parts from being scattered in the storage portion. Additionally, a supply cassette includes a hopper provided at a lower portion thereof and having a storage portion for storing chip-type electronic parts charged therein through an opening in an upper surface thereof, a central portion of the storage portion being recessed to provide an inclined surface for gathering the electronic parts; an interrupting plate mounted within the storage portion in an inclined manner, a gap for allowing the passage of the electronic parts therethrough formed between one end of said interrupting plate and the inclined surface of the storage portion; a discharge pipe for discharging the electronic parts, the discharge pipe extending from the exterior of the hopper through a lower surface of the hopper to the storage portion, and being connected to the storage portion; a slide pipe slidably fitted on an outer periphery of the discharge pipe; and engagement ribs formed on the upper surface of the storage portion. A chip-type electronic part storage casing is further connected to an upper portion of the hopper through the engagement ribs.

9 Claims, 11 Drawing Sheets

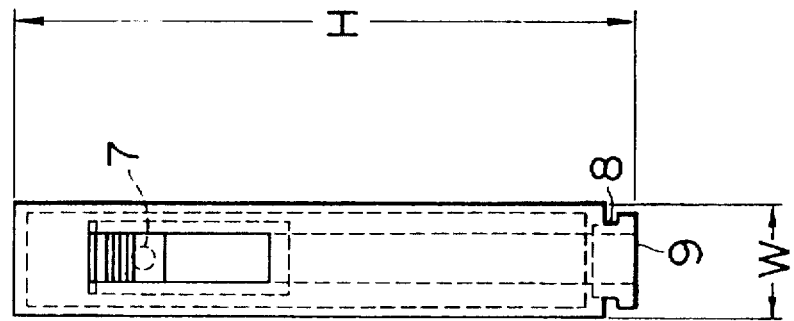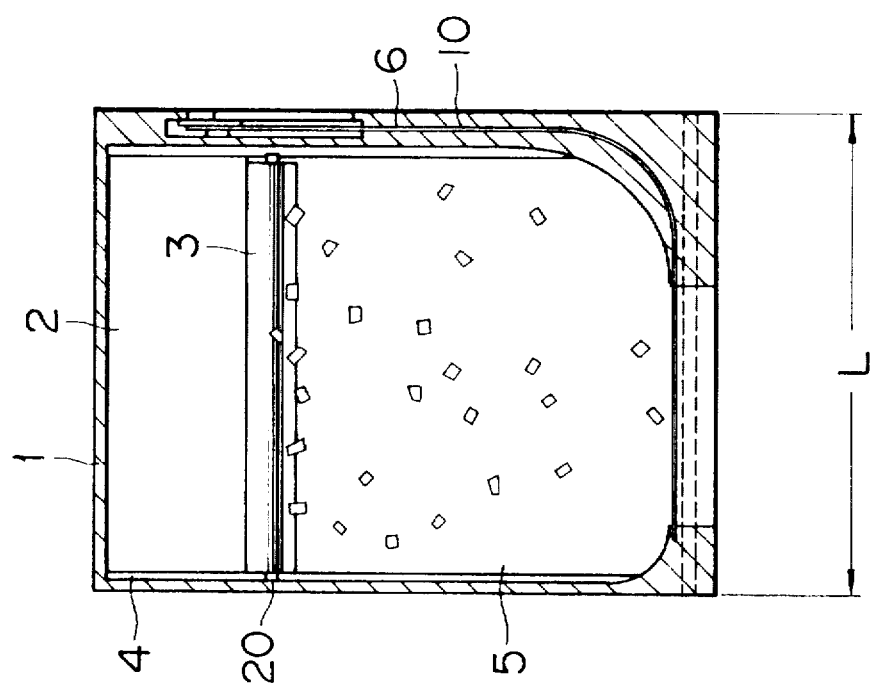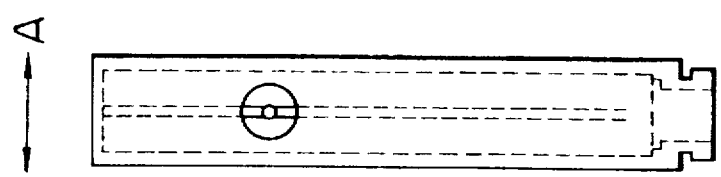

CHIP-TYPE ELECTRONIC PART STORAGE CASING AND SUPPLY CASSETTE USING SAME

FIELD OF THE INVENTION

This invention relates to a chip-type electronic part storage casing for storing chip-type electronic parts in a loose condition and for supplying these electronic parts one by one, the storage casing being used in combination with an electronic part-mounting apparatus for packaging the chip-type electronic parts on a printed board. The invention also relates to a supply cassette using such a storage casing.

BACKGROUND OF THE INVENTION

FIGS. 15(a) to 15(c) are perspective views showing the configuration of conventional chip-type electronic parts. FIG. 15(a) shows the chip-type electronic part 35 in the form of a capacitor having an electrode 35a; FIG. 15(b) shows the chip-type electronic part 36 in the form of a resistor having an electrode 36a; and FIG. 15(c) shows the chip-type electronic part 37 in the form of a resistor having an electrode 37a.

As a supply mode of supplying these chip-type electronic parts 35 to 37 (hereinafter referred to as "chip-type electronic parts 35") by a supply device, there have heretofore been used methods using taping, a magazine, a tray and so on. Among these, the taping system achieves a high reliability at the time of mounting, and has therefore been the system of choice. However, the mounting speed of a chip-type electronic part-mounting apparatus has continued to increase, while the amount of storage for the chip-type electronic parts by the taping system is small. Therefore the frequency of tape exchanges has increased. For this reason, attention has now been drawn to a loose supply mode providing a large storage capacity, and a chip-type electronic part storage casing capable of storing chip-type electronic parts 35 in a loose condition has been standardized as "EIAJ-ET7201".

FIG. 16 shows the above standardized chip-type electronic part storage casing 40. In this chip-type electronic part storage casing 40, a leaf spring 42 is mounted through a slide structure for closing an opening 43 to seal the chip-type electronic parts 35. A projection 41 for opening and closing the leaf spring 42 is mounted on a distal end of the leaf spring 42. The chip-type electronic part storage casing 40 of this construction is attached to an electronic part supply device (not shown) through slide grooves 44, with the opening 43 directed downwardly, and the chip-type electronic parts 35 successively drop to be transferred into the electronic part supply device.

The chip-type electronic part storage casings 40 of this construction store different kinds of chip-type electronic parts 35, respectively, and are attached to respective electronic part supply devices, and in this condition the plurality of storage casings 40 are mounted parallel on the electronic part-mounting apparatus, and are used in this condition. The electronic part supply device, to which the chip-type electronic part storage casing 40 storing the selected kind of chip-type electronic parts 35 is attached, is moved laterally, so that the parts can be taken out of a predetermined supply position in the electronic part-mounting apparatus.

With the above conventional construction, however, the frequency of lateral movement of the electronic part supply device increases with the increase of the mounting speed of the electronic part-mounting apparatus, and besides, since the acceleration of the movement reaches 2~3G, there occurs a conspicuous phenomenon in which each time the electronic part supply device moves laterally, upper ones of the chip-type electronic parts 35 remaining in the chip-type electronic part storage casing 40, are scattered to impinge on an inner surface of the chip-type electronic part storage casing 40, and when this occurs repeatedly, there has been encountered a problem that the electrodes 35a of the chip-type electronic parts 35 rub each other, or are rubbed by the inner surface of the chip-type electronic part storage casing 40, so that dust is produced.

If this dust deposits on other portions of the chip-type electronic part 35 than the electrode 35a, there arise problems that the resistivity or the capacitance is varied of part 35, and that recognition accuracy cannot be obtained at the time of packaging.

Also, when this dust deposits on the inner surface of the chip-type electronic part storage casing 40, the chip-type electronic parts 35 are kept adhered to the inner surface of the chip-type electronic part storage casing 40 by the dust even if an anti-static resin is used as a material for the chip-type electronic part storage casing 40, and there has been encountered many problems such as a problem that when exchanging the chip-type electronic parts 35, a different kind of chip-type electronic parts are included.

The above chip-type electronic part storage casing 40 has standardized dimensions W×L×H (12 mm×36 mm×110 mm), and for example, if the chip-type electronic parts 35 are ones called "2125" of 2 mm×1.25 mm×0.7 mm t, this casing can store only about 10,000 of these parts. These parts, when supplied continuously, are consumed in about 20 minutes, and even when these parts are to be mounted on the necessary portion of the printed board together with other kinds of chip-type electronic parts at the same time, they are consumed in 3~4 hours, thus posing a problem that the continuous operation can not be carried out.

SUMMARY OF THE INVENTION

The present invention seeks to solve the above problems of the conventional technique, and an object of the invention is to provide a chip-type electronic part storage casing which prevents chip-type electronic parts in the chip-type electronic part storage casing from producing dust when an electronic part supply device moves laterally, thereby achieving a stable supply, and has a greatly-increased storage capacity for chip-type electronic parts. Another object is to provide a supply cassette using such a casing.

To solve these problems, the present invention provides a chip-type electronic part storage casing comprising a storage portion for storing a plurality of chip-type electronic parts in a loose condition; an opening formed in a lower surface of the storage portion for discharging the chip-type electronic parts; a shutter slidably mounted and extending from the opening along a peripheral portion of the storage portion for opening and closing the opening; and a scatter prevention member provided within the storage portion for preventing the plurality of chip-type electronic parts, stored in the storage portion, from being scattered.

Also, there is provided a supply cassette which comprises a hopper provided at a lower portion thereof, the hopper comprising a storage portion for storing chip-type electronic parts charged thereinto through an opening in an upper surface thereof, a central portion of the storage portion being recessed to provide an inclined surface for gathering the chip-type electronic parts together; an interrupting plate mounted within the storage portion in an inclined manner, a gap for allowing the passage of the chip-type electronic parts therethrough being formed between one end of the interrupting plate and the inclined surface of the storage portion; a discharge pipe for discharging the chip-type electronic parts, the discharge pipe extending from the exterior of the hopper through a lower surface of the hopper to the storage portion, and being connected to the storage portion; a slide pipe slidably fitted on an outer periphery of the discharge pipe; and engagement ribs formed on the upper surface of the storage portion; wherein a chip-type electronic part storage casing is connected to an upper portion of the hopper through the engagement ribs, formed on the upper surface of the hopper, to form the supply cassette.

With this construction, even if the chip-type electronic part storage casing is formed into a large size, the scatter prevention member, mounted within the storage portion, prevents those chip-type electronic parts, disposed at an upper position, from jumping or impinging on an inner surface of the storage portion during lateral movement of an electronic part supply device, thereby preventing electrode portions from producing dust.

The interrupting plate provided within the hopper prevents an excessive amount of chip-type electronic parts from being charged into the hopper, thereby preventing undue impact and load from being applied to the chip-type electronic parts, thus preventing the production of dust.

BRIEF DESCRIPTION OF THE DRAWINGS

FIG. 1(a) is a left side-elevational view showing the construction of a chip-type electronic part storage casing according to a first embodiment of the present invention;

FIG. 1(b) is a front cross-sectional view of the above casing;

FIG. 1(c) is a right side-elevational view of the above casing;

DETAILED DESCRIPTION OF THE INVENTION

Figure 2A:
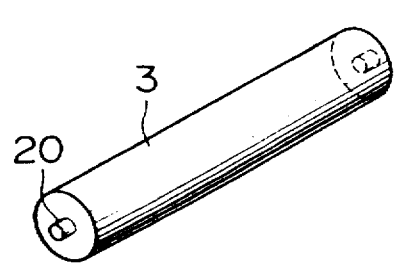
FIG. 2 is a perspective view showing the configuration of scatter prevention members in the above embodiment.

A first embodiment of the present invention will now be described with reference to the drawings.

FIGS. 1(a), 1(b) and 1(c) are respectively, a left side-elevational view, a front cross-sectional view and a right side-elevational view of a first embodiment of a chip-type electronic part storage casing 1. In these figures, numeral 1 denotes the chip-type electronic part storage casing, numeral 2 a storage portion provided in the chip-type electronic part storage casing 1, numeral 3 a scatter prevention member mounted within the storage portion 2, numeral 4 slits formed in an inner side of the storage portion 2 in opposed relation to each other, numeral 5 chip-type electronic parts, numeral 6 a shutter utilizing a leaf spring, numeral 7 a projection connected to a distal end of the shutter 6, numeral 8 slide grooves used for attaching the chip-type electronic part storage casing 1, numeral 9 an opening formed in a lower surface, numeral 10 a groove formed in the inner side of the storage portion 2 along which groove the shutter 6 extends, and numeral 20 shafts formed respectively on opposite ends of the scatter prevention member 3. The shafts 20 are fitted respectively in the slits 4, so that the scatter prevention member 3 is movable upward and downward within the storage portion 2. This chip-type electronic part storage casing 1 is mounted on an electronic part supply device (not shown) with the opening 9 directed downwardly, and is used in this condition.

When the projection 7 is pulled upwardly in the above Figures, the shutter 6 connected to the projection 7 is moved along the groove 10, and therefore that portion of the shutter 6 disposed above the opening 9 is drawn, so that the chip-type electronic parts 5 within the storage portion 2 are caused to drop through this opening with the result that a space is formed at an upper portion of the storage portion 2.

The chip-type electronic part storage casing of this construction stores a number of chip-type electronic parts 5 therein, and is attached to the electronic part supply device (not shown), and in this condition this casing is reciprocally moved laterally in a direction of arrow A at a speed producing acceleration of 2~3 G. At this time, if the scatter prevention member 3 is made of a material such as a resin smaller in specific gravity than the chip-type electronic parts 5, it rises to the surface of the chip-type electronic parts 5 due to vibrations and impacts, and the chip-type electronic parts 5 at the surface are interrupted by the scatter prevention member 3, and therefore can be prevented from being scattered.

Figure 2B:
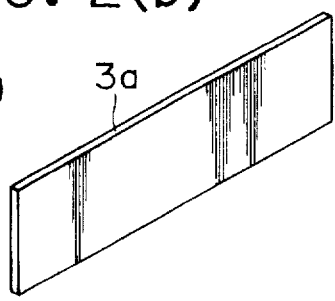
Figure 2C:
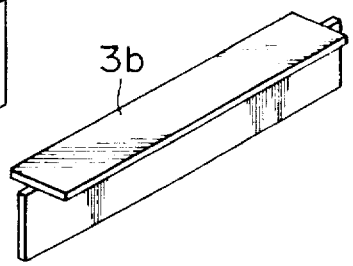

FIGS. 2(a), 2(b) and 2(c) show examples of configurations for the above scatter prevention member 3. FIG. 2(a) shows a cylindrical scatter prevention member 3 having shafts 20 formed respectively on opposite ends thereof. FIG. 2(b) shows a scatter prevention member 3a in the form of a flat plate, and FIG. 2(c) shows a scatter prevention member 3b having a T-shaped cross-section. Opposite end portions of each of the scatter prevention members 3a and 3b are fitted respectively in the slits 4 in the storage portion 2 so that the scatter prevention member 3a, 3b can move upward and downward. Any of the configurations can prevent the scattering of the chip-type electronic parts 5 as described above, and even if a large vibration or impact is applied to the storage portion 2 in a lateral direction, the chip-type electronic parts 5 stored therein can be prevented from being scattered within the storage portion 2, thus entirely solving the problem that the electrodes of the chip-type electronic parts 5 are rubbed to produce dust, thereby enabling the stable supply. Therefore, even a great increase in the storage capacity can be sufficiently dealt with.

Thus, even if the chip-type electronic part storage casing 1 of this embodiment is formed into a large size (W×L×H: 16 mm×70 mm×108 mm) as shown in FIG. 1, the above effect of the scatter prevention member 3 can be maintained, and besides, the casing can store about 25,000 of chip-type electronic parts 35 of 2 mm×1.25 mm×0.7 mm t called "2125" described in connection with the above conventional example. Thus, the storage capacity is increased 2.5 times, and the casing can be used for about 50 minutes in a continuous operation, and also can be used for about 10 hours in an actual packaging operation. Thus, the long-time continuous operation can be effected, and also the operation can be effected even at night, so that the quality and the productivity can be greatly enhanced at the same time.

The scatter prevention member 3 may have any configuration in so far as it can prevent the scattering of the chip-type electronic parts 5, and there may be used a method in which the scatter prevention member 3 is fixedly mounted within the storage portion 2. Thus, the scatter prevention member is not to be limited to the configuration and construction shown in the above embodiment.

A second embodiment of the present invention will now be described with reference to the drawings.

Figure 3A:
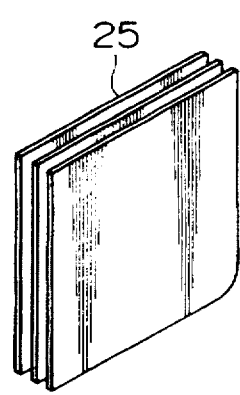
FIG. 3 is a perspective view showing the configuration of scatter prevention members according to a second embodiment of the present invention.
Figure 3B:
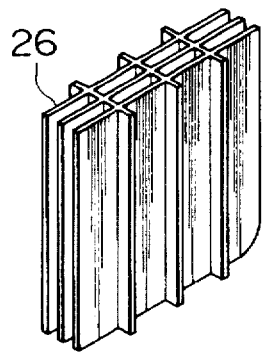
Figure 3C:
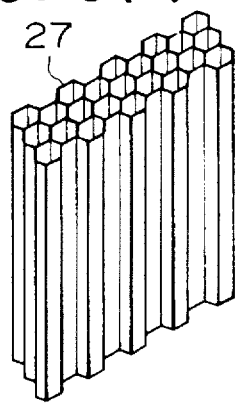

FIGS. 3(a), 3(b) and 3(c) are perspective views respectively showing scatter prevention members used in a chip-type electronic part storage casing 1 of this embodiment. FIG. 3(a) shows the scatter prevention member 25 of the uniformly-spaced type comprising a plurality of flat plates, which are spaced from one another at predetermined equal intervals, and are connected together. This member is fixedly secured to an inner surface of a storage portion 2 to partition the interior of the storage portion 2 into a plurality of small spaces, thus limiting the distance of scattering of the chip-type electronic parts 5 to a small interval.

FIG. 3(b) shows the lattice-type scatter prevention member 26 having a lattice-like configuration, and FIG. 3(c) shows the honeycomb-type scatter prevention member 27 of such a configuration that holes of a hexagonal shape or the like are arranged in a staggered manner. Any of the scatter prevention members is received within the storage portion 2, and is fixedly secured to the inner surface of the storage portion 2 to partition the interior of the storage portion 2 into a plurality of small spaces, thus limiting the distance of scattering of the chip-type electronic parts 5 to a very small length, so that similar effects as in the first embodiment can be obtained.

Figure 4A:
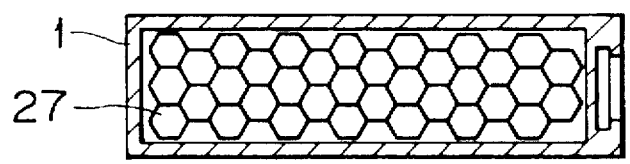
FIG. 4(a) is a horizontal cross-sectional view showing the construction of a chip-type electronic part storage casing of the above embodiment.
Figure 4B:
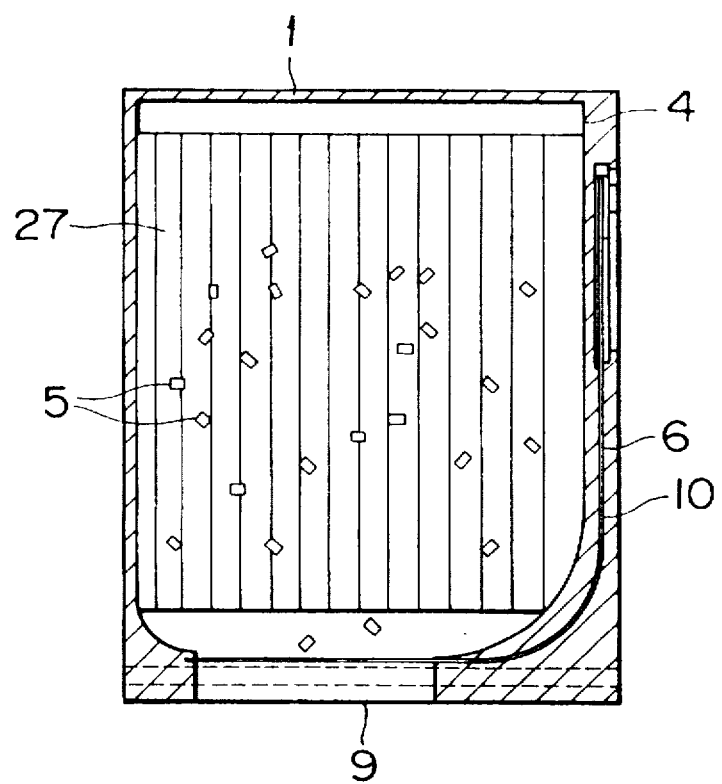
FIG. 4(b) is a front cross-sectional view of the above casing.

FIGS. 4(a) and 4(b) are a horizontal cross-sectional view and a front cross-sectional view, respectively, of the chip-type electronic part storage casing 1 having the honeycomb-type scatter prevention member 27 of FIG. 3(c) mounted therein, and a plurality of small spaces are formed within the storage portion 2, as described above.

A third embodiment of the present invention will now be described with reference to the drawings.

Figure 5A:
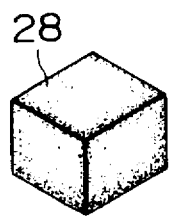
FIGS. 5a and 5b are perspective views showing the configuration of scatter prevention members according to a third embodiment of the present invention.
Figure 5B:
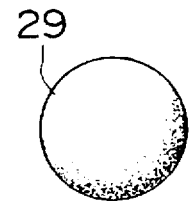

FIGS. 5(a) and 5(b) are perspective views respectively showing scatter prevention members used in a chip-type electronic part storage casing 1 of this embodiment. FIG. 5(a) shows the scatter prevention member 28 having a block-like configuration such as a cube and a rectangular parallelepiped, and FIG. 5(b) shows the scatter prevention member 29 having a spherical configuration. The scatter prevention members 28 and 29 are made of a material such as sponge or soft rubber which is smaller in specific gravity than the chip-type electronic parts 5 to be stored, and will not produce an impact sound upon impingement on a wall surface of a storage portion 2. The size of these scatter prevention members is so determined that their maximum dimension is equal to an inner dimension of the smallest portion of the storage portion 2, and a plurality of scatter prevention members are put into the storage portion 2, and are used.

Figure 6A:
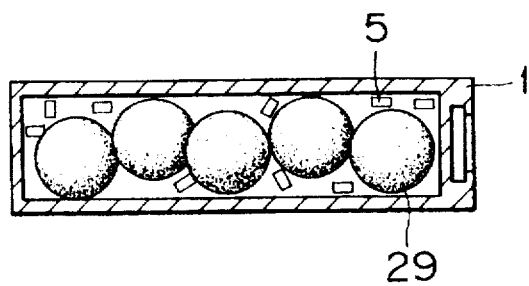
FIG. 6(a) is a horizontal cross-sectional view showing the construction of a chip-type electronic part storage casing of the above embodiment.
Figure 6B:
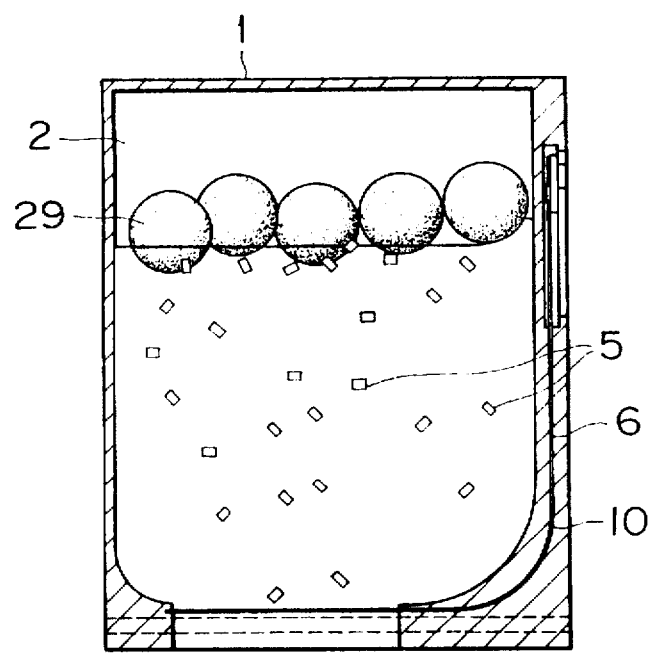
FIG. 6(b) is a front cross-sectional view of the above casing.

FIGS. 6(a) and 6(b) are a horizontal cross-sectional view and a front cross-sectional view, respectively, showing a condition in which a plurality of scatter prevention members 29 described above are received within the storage portion 2. Since the scatter prevention members 29 are smaller in specific gravity than the chip-type electronic parts 5, they rise to the upper surface, and although the chip-type electronic parts 5 are scattered together with the scatter prevention members 29, most of the chip-type electronic parts 5 impinge on the scatter prevention members 29, so that the impact is relieved. Thus, similar effects as in the above first and second embodiments can be obtained. In this case, since the scatter prevention members 28, 29 do not need to be connected to the inner side of the storage portion 2, it is not necessary to make any arrangement to the chip-type electronic part storage casing 1 and the storage portion 2, and therefore the effects can be obtained easily and inexpensively.

A fourth embodiment of the present invention will now be described with reference to the drawings.

Figure 7A:
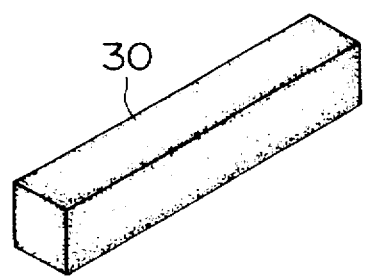
FIGS. 7a and 7b are perspective views showing the configuration of scatter prevention members according to a fourth embodiment of the present invention.
Figure 7B:
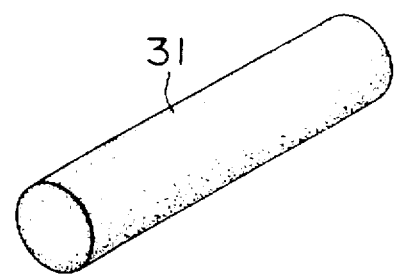

FIGS. 7(a) and 7(b) are perspective views respectively showing scatter prevention members used in a chip-type electronic part storage casing 1 of this embodiment. FIG. 7(a) shows the scatter prevention member 30 in the form of an elongated body of a square or a rectangular cross-section, and FIG. 7(b) shows the cylindrical scatter prevention member 31 of a circular cross-section. The scatter prevention members 30 and 31 are made of a mesh material, such as foamed styrol, sponge, paper or a resin, which is smaller in specific gravity than the chip-type electronic parts 5 to be stored, and will not produce an impact sound upon impingement on an inner surface of a storage portion 2. The size of these scatter prevention members is slightly smaller than an inner dimension of a storage portion 2, and each scatter prevention member is put into the storage portion 2, and is used.

Figure 8A:
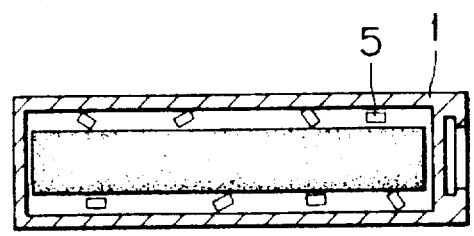
FIG. 8(a) is a horizontal cross-sectional view showing the construction of a chip-type electronic part storage casing of the above embodiment.
Figure 8B:
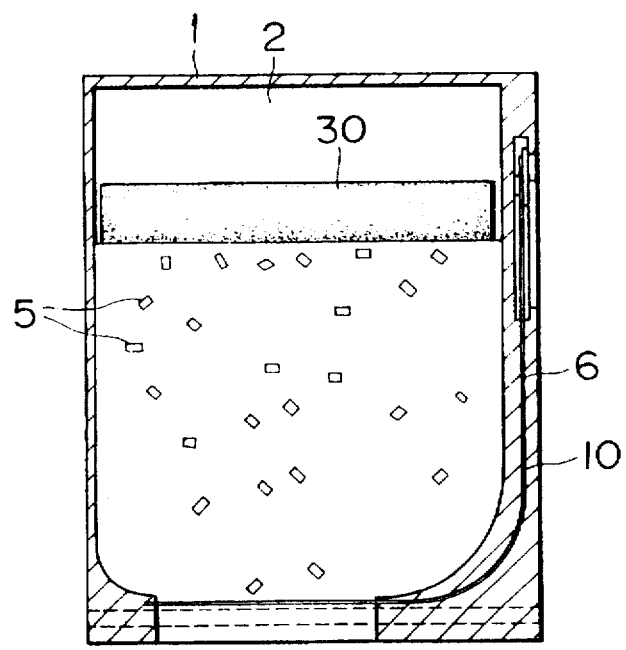
FIG. 8(b) is a front cross-sectional view of the above casing.

FIGS. 8(a) and 8(b) are a horizontal cross-sectional view and a front cross-sectional view, showing a condition in which the scatter prevention member 30 made of foamed styrol is received within the storage portion 2. With this construction, the scatter prevention member 30 holds those chip-type electronic parts 5 disposed at an upper position to prevent the scattering of the electronic parts, so that similar effects as in the above 1st to 3rd embodiments can be obtained.

In this case, since the scatter prevention member 30, 31 does not need to be connected to the inner side of the storage portion 2, it is not necessary to make any arrangement to the chip-type electronic part storage casing 1 and the storage portion 2, and therefore the effects can be obtained easily and inexpensively.

A fifth embodiment of the present invention will now be described with reference to the drawings.

Figure 9:
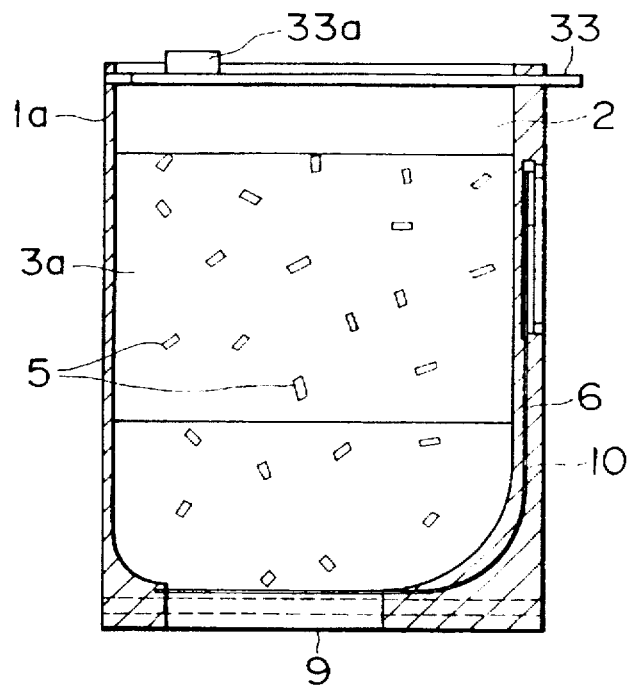
FIG. 9 is a front cross-sectional view showing the construction of a chip-type electronic part storage casing according to a fifth embodiment of the present invention.
Figure 10:
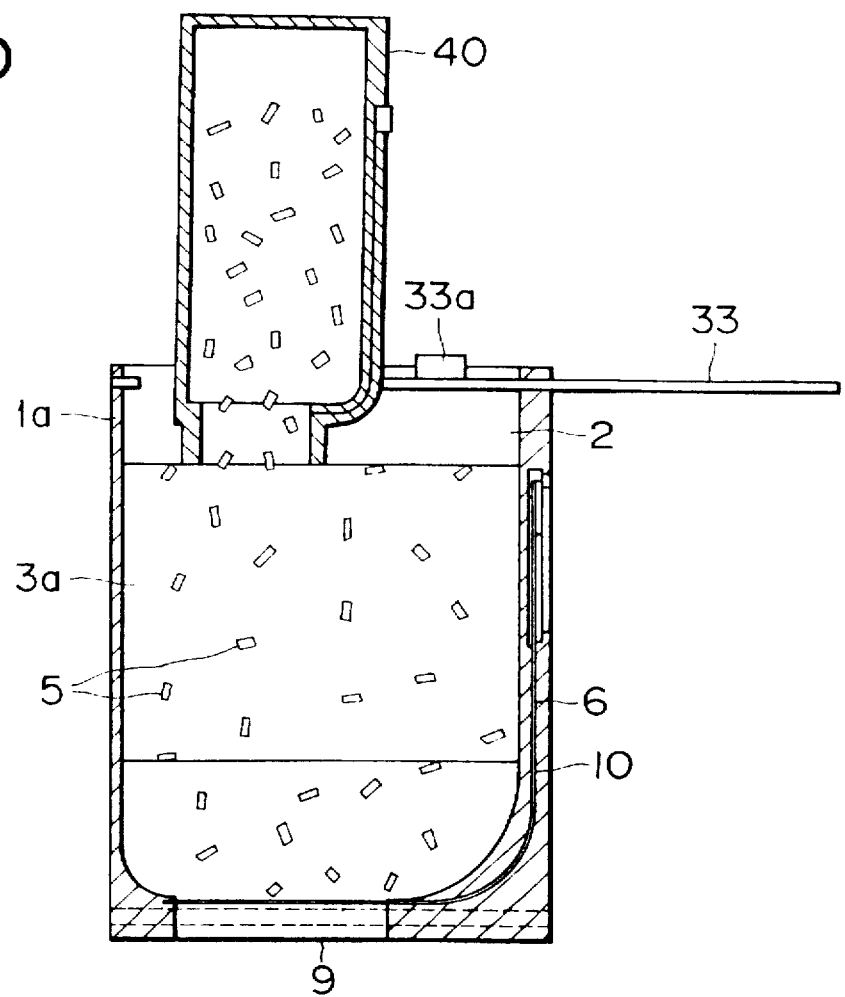
FIG. 10 is a front cross-sectional view showing the manner of using the chip-type electronic part storage casing of the embodiment of FIG. 9.
Figure 11:
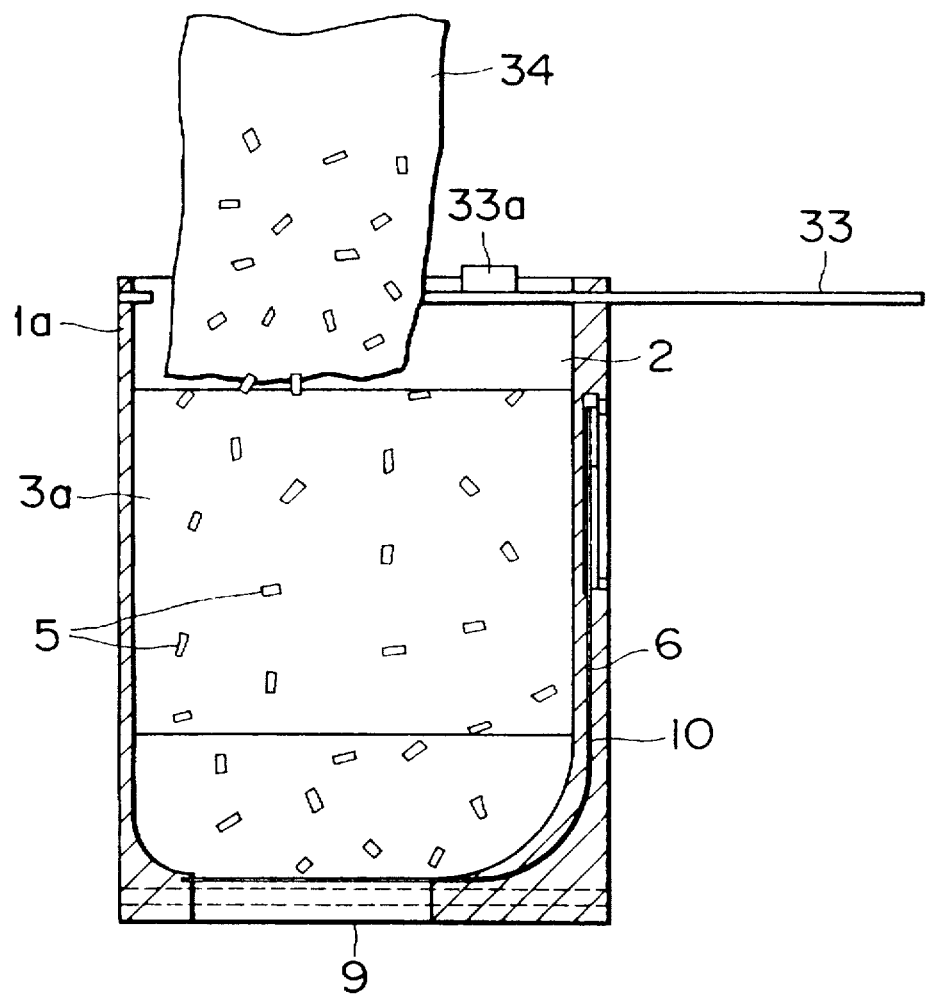
FIG. 11 is a front cross-sectional view showing the manner of using the chip-type electronic part storage casing of the embodiment of FIG. 9.

FIG. 9 is a front cross-sectional view showing a chip-type electronic part storage casing of this embodiment, and FIGS. 10 and 11 are front elevational views showing examples of use of this chip-type electronic part storage casing. In FIGS. 9 to 11, numeral 1a denotes the chip-type electronic part storage casing within which a scatter prevention member 3a comprising flat plates is mounted. A lid 33 for allowing the charging of the chip-type electronic parts 5 into a storage portion 2 is mounted on an upper portion of the chip-type electronic part storage casing 1 for opening and closing movement. For opening and closing the lid 33, this lid can be slidingly moved easily by a projective 33a mounted on one end of the lid 33. The other construction is similar to that of the above 1st to 4th embodiments, and therefore detailed explanation thereof will be omitted.

The chip-type electronic part storage casing 1a of this embodiment having the above construction can be formed into a large size to increase its storage capacity as described above for the above embodiments, and also the quality can be enhanced. And besides, a supply of the chip-type electronic parts 5, stored in the standardized chip-type electronic part storage casing 40 as described for the conventional example, can be easily transferred into the storage casing 1a by opening the lid 33 provided at the upper portion thereof, as shown in FIG. 10. Similarly, a supply of the chip-type electronic parts 5, stored in a polyethylene bag 34 as shown in FIG. 11, can be easily transferred. Therefore, the efficiency of the operation and the productivity can be markedly enhanced.

A sixth embodiment of the present invention will now be described with reference to the drawings.

Figure 12A:
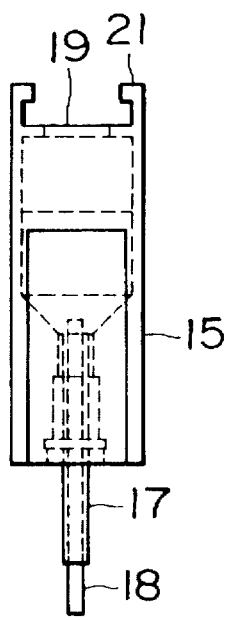
FIG. 12(a) is a left side-elevational view showing the construction of a hopper according to a fifth embodiment of the present invention.
Figure 12B:
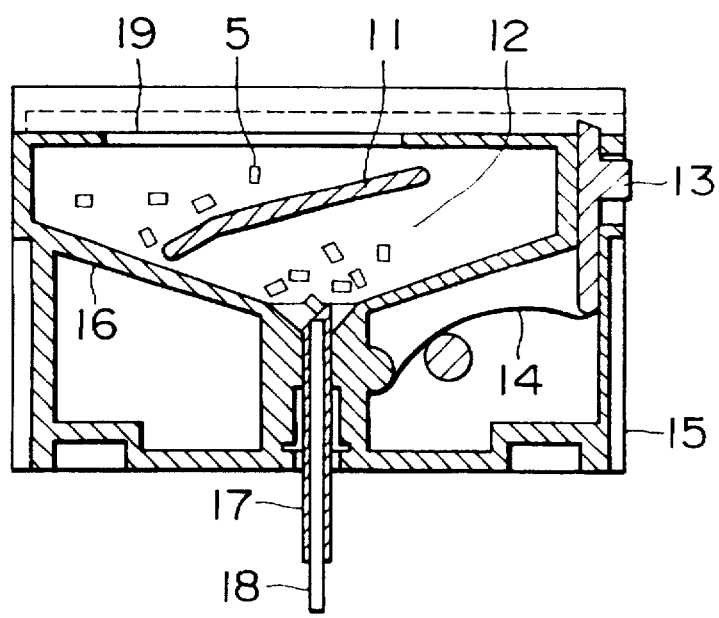
FIG. 12(b) is a front cross-sectional view of the hopper of FIG. 12(a)

FIG. 12(a) and FIG. 12(b) are a left side-elevational view and a front cross-sectional view, respectively, of a hopper of this embodiment. In these Figures, numeral 15 denotes the hopper. This hopper 15 has engagement ribs 21 at its upper end for engagement with a chip-type electronic part storage casing (not shown), and an opening 19 is formed in an upper surface of the hopper 15 for causing the chip-type electronic parts 5, stored in the chip-type electronic part storage casing, to drop into the hopper 15.

Numeral 16 denotes a tapered portion for gathering the chip-type electronic parts 5, introduced into the hopper 15, into one position, numeral 11 an interrupting plate mounted above the tapered portion 16, numeral 18 a discharge pipe extending through a lower side of the hopper 15 to be connected thereto for discharging the chip-type electronic parts 5, numeral 17 a slide pipe fitted on an outer periphery of the discharge pipe 18 for upward and downward sliding movement therealong, numeral 13 a lock member for locking the chip-type electronic part storage casing (not shown) when this storage casing is engaged with the upper portion of the hopper 15, and numeral 14 a leaf spring urging the lock member 13.

Figure 13:
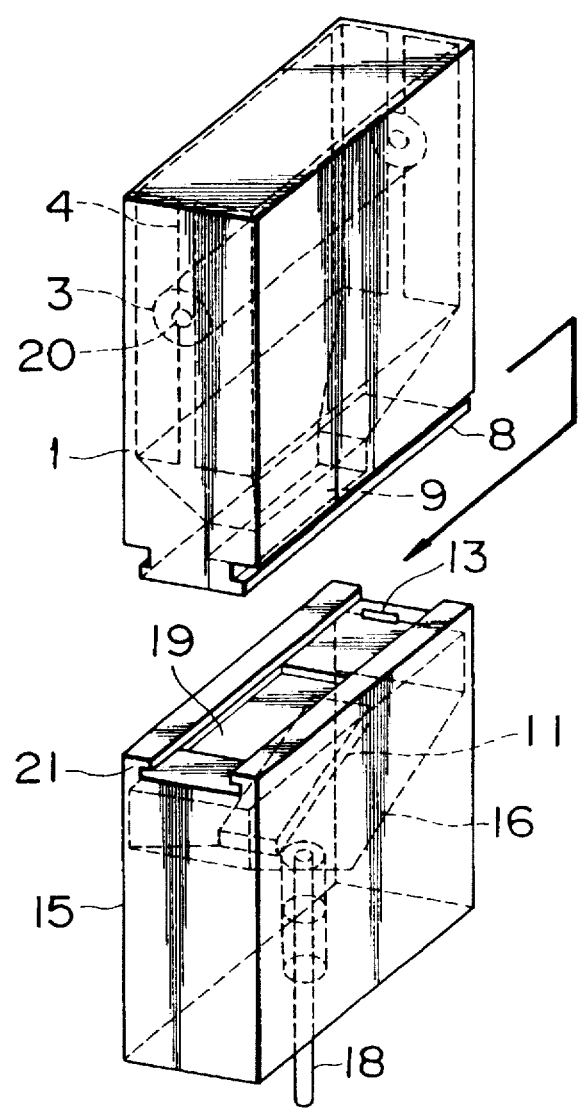
FIG. 13 is a perspective view showing a condition in which a chip-type electronic part storage casing and the hopper according to the above embodiment are to be connected together to provide a supply cassette.

FIG. 13 shows a condition in which the chip-type electronic part storage casing 1, incorporating the scatter prevention member 3 described in the first embodiment, is to be engaged with the upper surface of the hopper 15. The slide grooves 8 in the lower end of the chip-type electronic part storage casing 1 are fitted respectively on the engagement ribs 21 formed on the upper end of the hopper 15, so that the chip-type electronic part storage casing 1 can be engaged with the hopper 15. A combination of the chip-type electronic part storage casing 1 and the hopper 15 thus connected together will be called a supply cassette, and the operation of this supply cassette will be described below.

The chip-type electronic parts 5, dropping through the opening 9 in the chip-type electronic part storage casing 1, pass through the opening 19 in the hopper 15, and further pass through a gap (1~5 mm) formed between the interrupting plate 11 and the tapered portion 16, and gather in the vicinity of the slide pipe 17. In this condition, although the discharge pipe 18 is fixedly connected to the hopper 15, the slide pipe 17 is of such a construction (not shown) that it is slidable upward and downward along the outer periphery of the discharge pipe 18. With this operation, the chip-type electronic parts 5 can be caused to successively drop to the discharge pipe 18.

The interrupting plate 11 is mounted at a central portion of the hopper 15 in an inclined condition, and the chip-type electronic parts 5 move progressively downward along the inclined surfaces of the interrupting plate 11 and tapered portion 16, and a space 12 is formed beneath and near the interrupting plate 11. Thus, care is taken so that an impact and a load, applied to the chip-type electronic parts 5 by the upper end of the slide pipe 17 during the upward and downward movement of the slide pipe 17, can be reduced as much as possible.

The supply cassette of the present invention having the above construction is capable of successively discharging and supplying the chip-type electronic parts 5, stored in the chip-type electronic part storage casing 1, from the discharge pipe 18 efficiently, and besides even if this supply cassette is subjected to a large lateral vibration or impact, the influence of such vibration and impact on the chip-type electronic parts 5 can be suppressed as much as possible. Furthermore, an impact and a load to be applied to the chip-type electronic parts 5 when successively discharging the chip-type electronic parts 5 from the hopper 15 can be reduced as much as possible.

A seventh embodiment of the present invention will now be described with reference to the drawings.

Figure 14A:
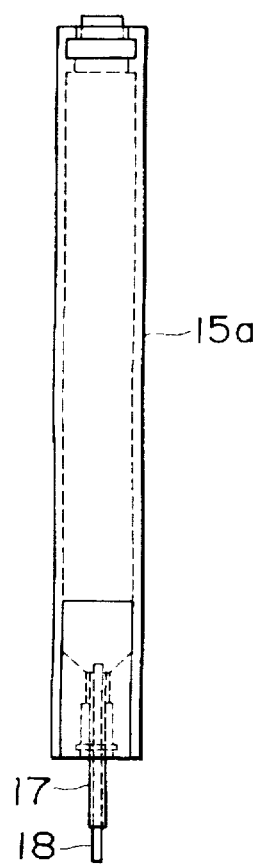
FIG. 14(a) is a left side-elevational view showing the construction of a supply cassette according to a seventh embodiment of the present invention.
Figure 14B:
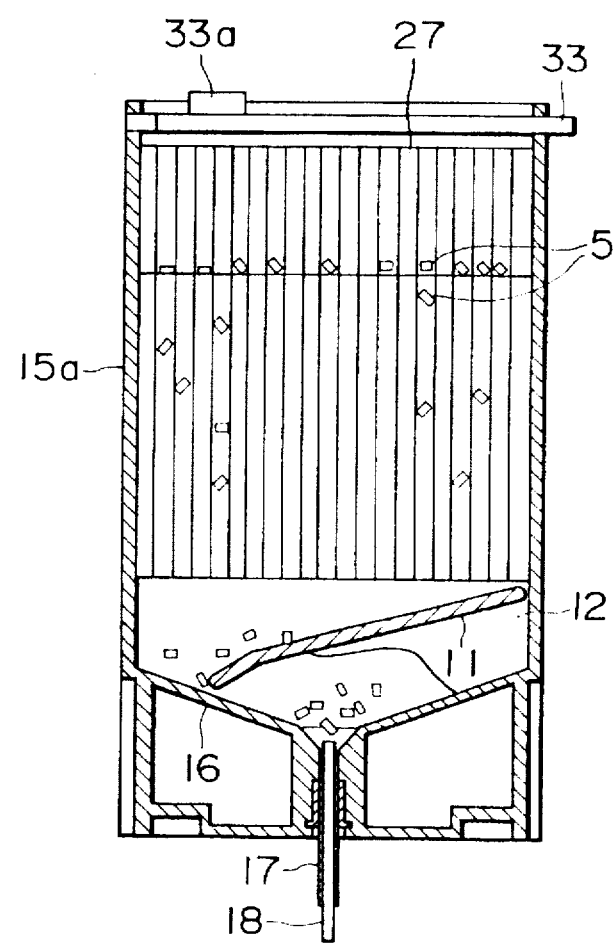
FIG. 14(b) is a front cross-sectional view of the supply cassette of FIG. 14(a)
Figure 14C:
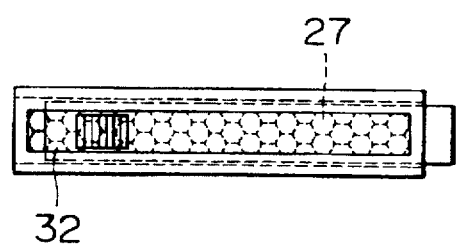
FIG. 14(c) is a plan view of the supply cassette of FIG. 14(a)
Figure 15A:
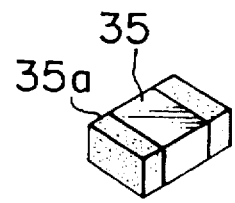
FIG. 15 is a perspective view showing chip-type electronic parts.
Figure 15B:
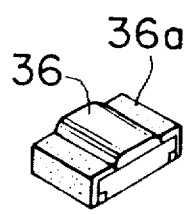
Figure 15C:
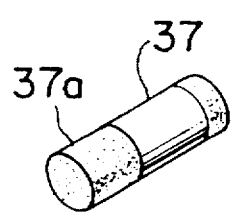
Figure 16:
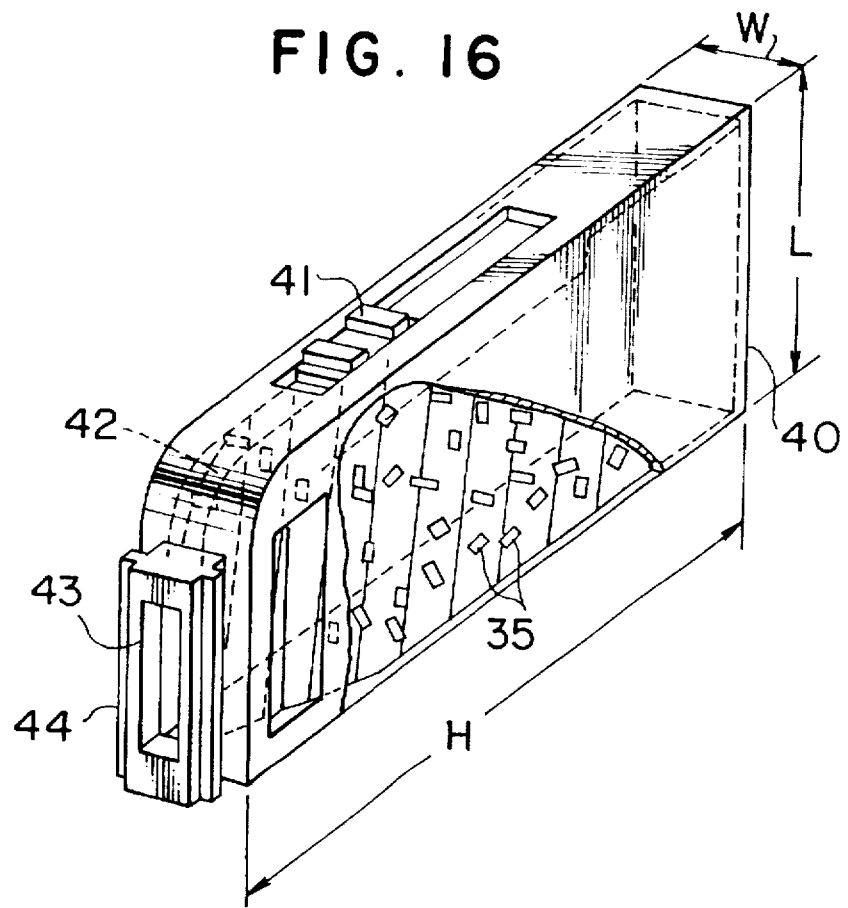
FIG. 16 is a perspective view showing the construction of a conventional chip-type electronic part storage casing.

FIGS. 14(a), 14(b) and 14(c) are a left side-elevational view, a front cross-sectional view and a plan view, respectively, showing the construction of a supply cassette of this embodiment. In this embodiment, a hopper 15 as described in the above sixth embodiment and a chip-type electronic part storage casing 1 are combined together into an integral construction. A honeycomb-type scatter prevention member 27 as described in the above second embodiment is used in this supply cassette of the integral construction.

In FIGS. 14(a), 14(b) and 14(c), those constituent parts identical in construction to those of the above sixth embodiment of FIGS. 12(a), 12(b) and 13 will be designated by identical reference numerals, respectively, and a detailed description thereof will be omitted.

In FIGS. 14(a), 14(b) and 14(c), numeral 32 denotes an opening formed in an upper surface, numeral 33a a projective mounted on a lid 33 for openably closing the opening 32, and numeral 15a a body. In addition to the effects achieved by the above sixth embodiment, the supply cassette of this embodiment can reduce costs by reducing the number of the component parts.

As described above, in the chip-type electronic part storage casing of the present invention and the supply cassette of the present invention using the same, the scatter prevention member for preventing the scattering of the chip-type electronic parts is provided within the chip-type electronic part storage casing, and the interrupting plate for relieving an impact and a load applied to the chip-type electronic parts is provided within the hopper. This construction is mounted on the supply portion of the electronic part-mounting apparatus for packaging the chip-type electronic parts on the printed board, and the chip-type electronic parts are protected from a lateral impact produced when selectively moving the electronic part supply device mounted on the supply portion of the electronic part-mounting apparatus, thereby eliminating the production of dust. As a result, a change in capacity value of the chip-type electronic parts can be prevented, and also the lowering of recognition accuracy at the time of packaging can be prevented, thus greatly enhancing reliability. Additionally, a large-size design can be used in which the storage capacity for the chip-type electronic parts is greatly increased while maintaining reliability, thus achieving an excellent design for a chip-type electronic part storage casing as well as the supply cassette using the same.

What is claimed is:

1. A chip-type electronic part storage casing comprising a storage portion for storing a plurality of chip-type electronic parts in a loose condition; an opening formed in a lower surface of said storage portion for discharging the chip-type electronic parts; a shutter slidably mounted and extending from said opening along a peripheral portion of said storage portion for opening and closing said opening; and a scatter prevention member provided within said storage portion for preventing the plurality of chip-type electronic parts, stored in said storage portion, from being scattered.

2. The chip-type electronic part storage casing according to claim 1, wherein said scatter prevention member is one of a uniformly-spaced type comprising a plurality of flat plates connected together and spaced from one another at predetermined intervals, a lattice-type of such a configuration that it defines holes arranged in a staggered manner, said scatter prevention member being received within said storage portion to partition the interior of said casing into a plurality of small spaces.

3. The chip-type electronic part storage casing according to claim 2, wherein the holes are hexagonal.

4. The chip-type electronic part storage casing according to claim 1, in which said scatter prevention member has one of a block-like configuration, and a spherical configuration, said scatter prevention member being made of a material smaller in specific gravity than the chip type electronic parts to be stored, and said scatter prevention member having such a size that its maximum dimension is equal to an inner dimension of the smallest portion of said storage portion storing the chip-type electronic parts.

5. The chip-type electronic part storage casing according to claim 6, wherein the scatter prevention member is configured as one of a cube and a rectangular parallelepiped.

6. The chip-type electronic part storage casing according to claim 1, wherein a lid for allowing the charging of the chip-type electronic parts is provided at an upper portion of said storage portion in such a manner that said lid can be opened and closed.

7. The chip-type electronic part storage casing according to claim 1, wherein said scatter prevention member is in the form of one of an elongated body of a square or a rectangular cross-section and a cylindrical body, said scatter prevention member being made of a material smaller in specific gravity than the chip-type electronic parts to be stored.

8. A supply cassette having a lower portion and comprising:

a hopper provided at said lower portion and comprising a storage portion for storing chip-type electronic parts charged therein through an opening in an upper surface thereof, a central portion of said storage portion being recessed to provide an included surface for gathering the chip-type electronic parts together; an interrupting plate mounted within said storage portion in an included manner, a gap for allowing the passage of the chip-type electronic parts therethrough being formed between one end of said interrupting place and said inclined surface of said storage portion; a discharge pipe for discharging the chip-type electronic parts, said discharge pipe extending from the exterior of said hopper through a lower surface of said hopper to said storage portion, and being connected to said storage portion; a slide pie slidably fitted on an outer periphery of said discharge pipe; and engagement ribs formed on the upper surface of said storage portion; and a chip-type electronic part storage casing connected to an upper portion of said hopper through said engagement ribs formed on the upper surface of said hopper.

9. The supply cassette according to claim 8, wherein said hopper and said chip-type electronic part storage casing are combined together into an integral construction.

* * * * *